US008478215B2

(12) United States Patent
Matsui

(10) Patent No.: US 8,478,215 B2
(45) Date of Patent: Jul. 2, 2013

(54) HARMONIC REJECTION MIXER AND PHASE ADJUSTMENT METHOD THEREOF

(75) Inventor: Naohiro Matsui, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 119 days.

(21) Appl. No.: 13/137,036

(22) Filed: Jul. 15, 2011

(65) Prior Publication Data

US 2012/0064850 A1    Mar. 15, 2012

(30) Foreign Application Priority Data

Sep. 14, 2010   (JP) ................................. 2010-205584

(51) Int. Cl.
*H03D 7/16*     (2006.01)
*H04B 1/10*     (2006.01)

(52) U.S. Cl.
USPC ........... 455/131; 455/302; 455/304; 455/323; 327/113; 331/12

(58) Field of Classification Search
USPC ............. 455/63.1, 67.13, 131, 296, 302, 303, 455/304, 313, 323, 334; 327/113, 355; 331/10, 331/11, 12
See application file for complete search history.

(56) References Cited

U.S. PATENT DOCUMENTS

| | | | | |
|---|---|---|---|---|
| 6,757,545 B2 * | 6/2004 | Nowak et al. | ............... | 455/456.2 |
| 7,085,547 B2 * | 8/2006 | Asayama et al. | ............. | 455/302 |
| 7,181,181 B2 * | 2/2007 | Lee et al. | ....................... | 455/260 |
| 7,421,259 B2 * | 9/2008 | Gomez et al. | ................. | 455/323 |
| 7,506,016 B2 | 3/2009 | Kasperkovitz | | |
| 7,860,480 B2 * | 12/2010 | Rafi et al. | ....................... | 455/323 |
| 7,986,192 B2 * | 7/2011 | Lee et al. | ....................... | 331/37 |
| 2009/0138744 A1 | 5/2009 | Kasperkovitz | | |
| 2010/0112971 A1 | 5/2010 | Matsuno et al. | | |

FOREIGN PATENT DOCUMENTS

| | | |
|---|---|---|
| JP | 2007-535830 A | 12/2007 |
| JP | 2008-523734 A | 7/2008 |
| JP | 2010-109918 A | 5/2010 |
| WO | WO 2005/055414 A1 | 6/2005 |
| WO | WO 2006/063358 A1 | 6/2006 |

OTHER PUBLICATIONS

Jeffrey A. Weldon, "A 1.75-GHz Highly Integrated Narrow-Band CMOS Transmitter With Harmonic-Rejection Mixers" IEEE Journal of Solid-State Circuits, vol. 36, No. 12, Dec. 2001.

* cited by examiner

*Primary Examiner* — Quochien B Vuong
(74) *Attorney, Agent, or Firm* — McGinn IP Law Group, PLLC

(57) ABSTRACT

A harmonic rejection mixer converts a frequency of a radio frequency signal by using a first to a third local signals (LOs) whose phases are different from each other, and the harmonic rejection mixer includes a phase difference detection circuit for detecting a phase difference between the first LO and the second LO, a phase difference detection circuit for detecting a phase difference between the first LO and the third LO, a phase adjustment circuit for adjusting the phase of the second LO so that the phase difference detected by the phase difference detection circuit becomes a first phase difference, and a phase adjustment circuit for adjusting the phase of the third LO so that the phase difference detected by the phase difference detection circuit becomes a second phase difference. It is thereby possible to achieve high precision harmonic rejection characteristics.

8 Claims, 12 Drawing Sheets

COMPOSITE WAVEFORM OF LO1+√(2) x LO2+LO3

HARMONIC REJECTION MIXER AND PHASE ADJUSTMENT METHOD THEREOF

CROSS-REFERENCES TO RELATED APPLICATIONS

The disclosure of Japanese Patent Application No. 2010-205584 filed on Sep. 14, 2010 including the specification, drawings and abstract is incorporated herein by reference in its entirety.

BACKGROUND

The present invention relates to a harmonic rejection mixer and a phase adjustment method and in particular to a harmonic rejection mixer using a feedback control and a phase adjustment method used in the harmonic rejection mixer.

CMOS (Complementary Metal Oxide Semiconductor) transistors are applied to gigahertz RF (Radio Frequency) band by recent fine gate processing technology. Thereby, wireless system LSIs in which CMOS process is used are generally-manufactured. Although a high operation frequency can be obtained by fine transistor processing technology, process variation due to the fine processing increases. How to compensate degradation of the characteristics due to the process variation generated in this way is a problem to be solved when integrating an analog high frequency circuit.

Here, a configuration of a receiver in a broadcast system or a communication system having a wide signal band will be described. The receiver in FIG. 8 includes an antenna 200, an LNA (Low Noise Amplifier) 201, a mixer 202, a signal source 203, a filter 204, a VGA (Variable Gain Amplifier) 205, and an ADC (Analog to Digital Converter) 206. As shown in FIG. 7, when receiving a desired signal fRF (Hz) from the antenna 200, harmonics such as fRF×3 and fRF×5 may come in as disturbing wave signals in the band. In this case, harmonic components (3×fLO, 5×fLO) of an LO (local) signal outputted from the signal source 203 and the disturbing wave signals are mixed and enter the desired receiving signal band. Thereby, there is a problem that the receiving characteristics are degraded.

As one of methods solving the problem, Jeffrey A. Weldon, "A 1.75-GHz Highly Integrated Narrow-Band CMOS Transmitter With Harmonic-Rejection Mixers" IEEE JOURNAL OF SOLID-STATE CIRCUITS, VOL. 36, NO. 12, December 2001 discloses a configuration of a harmonic rejection mixer circuit that can suppress $F_0 \times n$ (n=3, 5). The configuration of the harmonic rejection mixer circuit disclosed in Jeffrey A. Weldon, "A 1.75-GHz Highly Integrated Narrow-Band CMOS Transmitter With Harmonic-Rejection Mixers" IEEE JOURNAL OF SOLID-STATE CIRCUITS, VOL. 36, NO. 12, December 2001 will be described with reference to FIG. 9. The harmonic rejection mixer circuit shown in FIG. 9 includes an LO (local) signal source 801, a ¼ frequency dividing phase shifter 302, limiter amplifiers 303 to 305, mixer circuits 306 to 308, and gain adders 309 to 311. An operation of an ordinary harmonic rejection mixer circuit will be described with reference to FIGS. 10 and 11.

If the LO signal outputted from the LO signal source 301 is an ideal square wave, the square wave signal is represented by the following formula.

Formula 1

$$LO = An \sum_{n=1}^{\infty} \cos(n(\omega_{Lo} t + \varphi)) \quad (1)$$

$$An = \frac{\sin(n\pi)}{n\pi/4}$$

Relationship between the LO signal waveform and Fourier transform is represented by the following formula.

Formula 2

$$LO = \frac{4}{\pi}\left(\cos\omega_{Lo} t - \frac{1}{3}\cos 3\omega_{Lo} t + \frac{1}{5}\cos 5\omega_{Lo} t - \frac{1}{7}\cos 7\omega_{Lo} t \ldots \right) \quad (2)$$

When the LO signal and an RF signal are inputted in the mixer circuits 306 to 308, as shown in FIG. 10, mixed signal components multiplied by odd numbers are outputted. In the case of an ordinary receiver, harmonic signal components of three times (third-order) and five times (fifth-order) are components that degrade the receiving characteristics. Therefore, using the characteristics of trigonometric function, as shown in FIGS. 11 and 12, the third-order and the fifth-order signal components are cancelled by multiplying LO signals having phase differences of 45 degrees and 90 degrees as LO1+√(2)×LO2+LO3. LO1 is an LO signal used as a reference, LO2 is an LO signal having a phase difference of 45 degrees from LO1, and LO3 is an LO signal having a phase difference of 90 degrees from LO1.

Specifically, when, as LO signals, a 0-degree phase difference signal is defined as VLO_0, a 45-degree phase difference signal is defined as VLO_45, a 90-degree phase difference signal is defined as VLO_90, and a frequency component of each LO signal is calculated, the LO signals are represented by the following formulas.

Formula 3

$$\begin{aligned} VLO\_0 &= An\sum_{n=1}^{\infty} \cos\left(n\left(\omega_{Lo} t + \frac{\pi}{4}\right)\right) \\ &= \frac{4}{\pi}\left[\cos\left(\omega_{Lo} t + \frac{\pi}{4}\right) - \frac{1}{3}\cos\left(\omega_{Lo} t + \frac{3\pi}{4}\right) + \frac{1}{5}\cos\left(5\omega_{Lo} t + \frac{5\pi}{4}\right) - \frac{1}{7}\cos\left(7\omega_{Lo} t + \frac{7\pi}{4}\right) \ldots\right] \\ &= \frac{4}{\pi}\left[\frac{1}{\sqrt{2}}\cos\omega_{Lo} t - \frac{1}{\sqrt{2}}\sin\omega_{Lo} t + \frac{1}{3\sqrt{2}}\cos 3\omega_{Lo} t + \frac{1}{3\sqrt{2}}\sin 3\omega_{Lo} t - \frac{1}{5\sqrt{2}}\cos 5\omega_{Lo} t + \frac{1}{5\sqrt{2}}\sin 5\omega_{Lo} t - \frac{1}{7\sqrt{2}}\cos 7\omega_{Lo} t - \frac{1}{7\sqrt{2}}\sin 7\omega_{Lo} t \ldots\right] \end{aligned} \quad (3)$$

Formula 4

$$\begin{aligned} VLO\_45 &= An\sum_{n=1}^{\infty} \cos(n(\omega_{Lo} t)) \\ &= \frac{4}{\pi}\left(\cos\omega_{Lo} t - \frac{1}{3}\cos 3\omega_{Lo} t + \frac{1}{5}\cos 5\omega_{Lo} t - \frac{1}{7}\cos 7\omega_{Lo} t \ldots\right) \end{aligned} \quad (4)$$

-continued

Formula 5

$$VLO_{90} = An \sum_{n=1}^{\infty} \cos\left(n\left(\omega_{Lo}t - \frac{\pi}{4}\right)\right) \quad (5)$$

$$= \frac{4}{\pi}\left[\frac{1}{\sqrt{2}}\cos\omega_{Lo}t + \frac{1}{\sqrt{2}}\sin\omega_{Lo}t + \frac{1}{3\sqrt{2}}\cos3\omega_{Lo}t - \frac{1}{3\sqrt{2}}\sin3\omega_{Lo}t - \frac{1}{5\sqrt{2}}\cos5\omega_{Lo}t - \frac{1}{5\sqrt{2}}\sin5\omega_{Lo}t \ldots\right]$$

When these LO signals are substituted in the formula of LO1+√(2)×LO2+LO3, the following formula is established.

Formula 6

$$VLO\_0 + \sqrt{2} \times VLO\_45 + VLO\_90 = \quad (6)$$

$$\frac{4\sqrt{2}}{\pi}\left(2\cos\omega_{Lo}t - \frac{3}{7}\cos7\omega_{Lo}t + \ldots\right)$$

Thus, the third-order and the fifth-order components are cancelled and not generated.

Also, Japanese Unexamined Patent Application Publication (Translation of PCT Application) No. 2008-523734 discloses a configuration of a device for removing harmonics by a similar method as that described above. Japanese Unexamined Patent Application Publication No. 2010-109918 discloses a configuration of a receiver that can suppress a disturbing wave having frequencies near frequencies multiplied by an integer (2, 3, 4, 6, 8, 9, and so on) whose prime factors are 2 and/or 3 by using a multi-stage filter.

Japanese Unexamined Patent Application Publication (Translation of PCT Application) No. 2007-535830 discloses a configuration of a multiplier device for suppressing harmonic components by multiplying a plurality of mixing signals by an information signal modulated by a carrier and adding a weighting coefficient to each multiplied signal.

SUMMARY

However, in Jeffrey A. Weldon, "A 1.75-GHz Highly Integrated Narrow-Band CMOS Transmitter With Harmonic-Rejection Mixers" IEEE JOURNAL OF SOLID-STATE CIRCUITS, VOL. 36, NO. 12, December 2001, the third-order and the fifth-order components are cancelled in an ideal case in which noises and manufacturing variation do not occur. (This is the same in Japanese Unexamined Patent Application Publication (Translation of PCT Application) No. 2008-523734, Japanese Unexamined Patent Application Publication No. 2010-109918, and Japanese Unexamined Patent Application Publication (Translation of PCT Application) No. 2007-535830). Actually, there is manufacturing variation when manufacturing LSIs, so there is a problem that phase error occurs in the LO signals and the third-order and the fifth-order components are not cancelled. The harmonic rejection suppression ratios are represented as described below. In the formulas described below, $\alpha$ is a shift from a phase difference of 45 degrees, and $\beta$ is an amplitude error.

Formula 7

$$HRM_{3rd} = \left(\frac{1}{9}\right)\{((1 - \cos3\alpha)(1 + \beta))^2 + (1 + \beta)\sin3\alpha\} \quad (7)$$

Formula 8

$$HRM_{5th} = \left(\frac{1}{25}\right)\{((1 - \cos5\alpha)(1 + \beta))^2 + (1 + \beta)\sin5\alpha\} \quad (8)$$

FIG. 13 shows a graph of the harmonic suppression characteristics when the aforementioned errors occur. When manufacturing LSIs, phase errors and amplitude errors occur, so the suppression ratio is degraded according to these errors, and a tolerance of a receiver for the disturbing waves is degraded. Therefore, there is a case in which the receiver cannot perform communication. The harmonic rejection ratio characteristics are required to be 40 dBc to 50 dBc or more although depending on the receiving system. Therefore, the phase error is required to be smaller than 1 degree, in other words, an accuracy of substantially no error is required, so a circuit configuration for compensating the characteristics is required.

A harmonic rejection mixer according to a first aspect of the present invention converts a frequency of a radio frequency signal by using a first, a second, and a third local signals whose phases are different from each other, and the harmonic rejection mixer includes a first phase difference detection circuit for detecting a phase difference between the first local signal and the second local signal, a second phase difference detection circuit for detecting a phase difference between the first local signal and the third local signal, a first phase adjustment circuit for adjusting the phase of the second local signal so that the phase difference detected by the first phase difference detection circuit becomes a first phase difference, and a second phase adjustment circuit for adjusting the phase of the third local signal so that the phase difference detected by the second phase difference detection circuit becomes a second phase difference.

By using such a harmonic rejection mixer, it is possible to adjust the phase difference between the first and the second local signals and the phase difference between the first and the third local signals and convert the frequency of the radio frequency signal by using the local signals whose phases have been adjusted.

A phase adjustment method according to a second aspect of the present invention is a phase adjustment method of a first, a second, and a third local signals whose phases are different from each other in a harmonic rejection mixer for converting a frequency of a radio frequency signal by using the first, the second, and the third local signals, and the phase adjustment method includes the steps of calculating a first output voltage determined by a phase difference between the first local signal and a first reference signal having substantially the same phase as that of the first local signal, calculating a second output voltage determined by a phase difference between the first local signal and a second reference signal having a phase reverse to that of the first local signal, calculating a third and a fourth output voltages determined by a predetermined phase difference by using the first and the second output voltages, adjusting the phase of the first local signal according to the first output voltage, and adjusting the phases of the second and the third local signals according to the third and the fourth output voltages.

By using such a phase adjustment method, it is possible to adjust the phase difference between the first and the second local signals and the phase difference between the first and the third local signals and convert the frequency of the radio frequency signal by using the local signals whose phases have been adjusted.

The present invention can provide a harmonic rejection mixer and a phase adjustment method that can correct a phase error of a local signal generated due to manufacturing variation and the like and achieve high precision harmonic rejection characteristics.

DETAILED DESCRIPTION

First Embodiment

Figure 1:
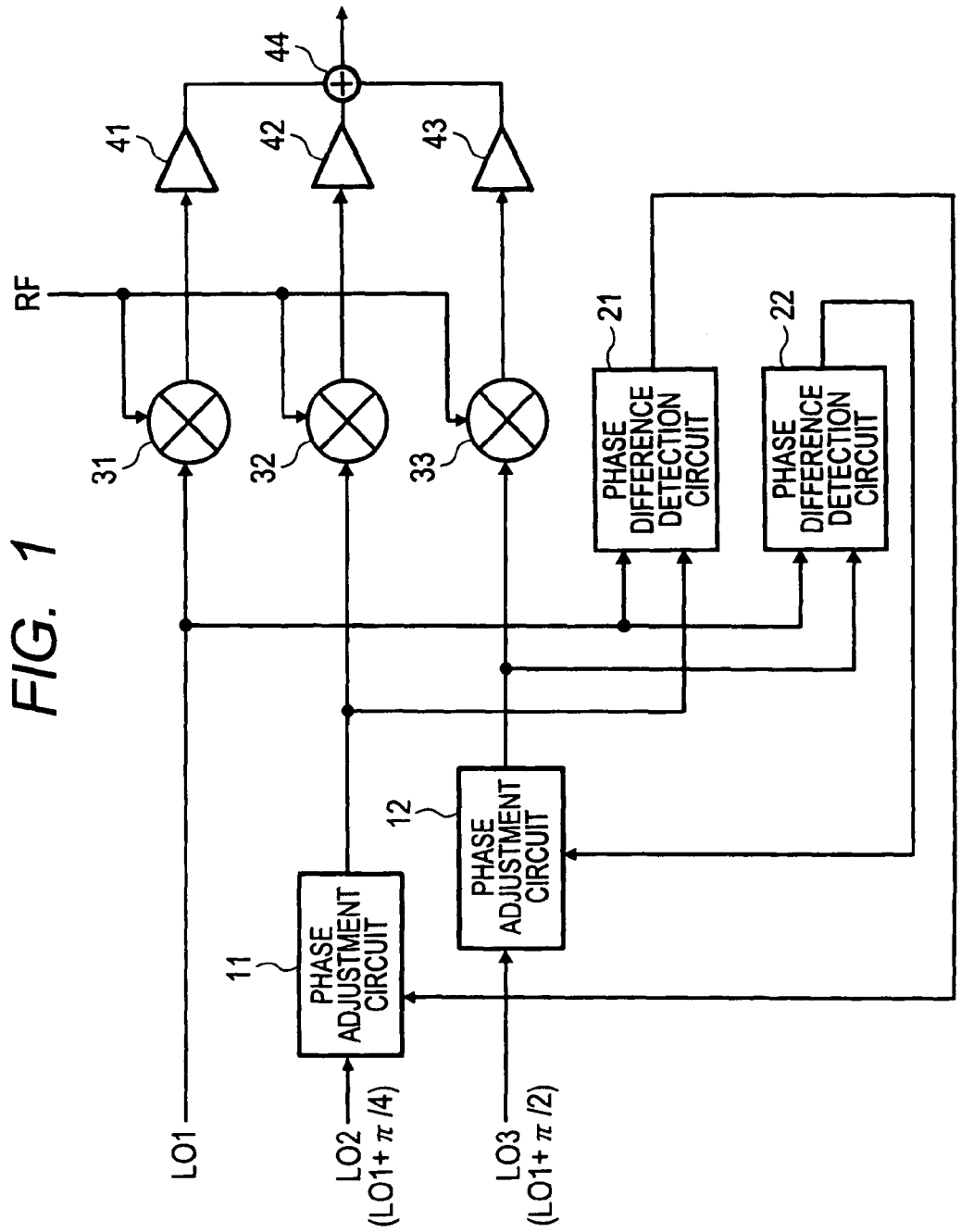
FIG. 1 is a configuration diagram of a harmonic rejection mixer according to a first embodiment.

Hereinafter, an embodiment of the present invention will be described with reference to the drawings. FIG. 1 is a configuration diagram of a harmonic rejection mixer according to the first embodiment of the present invention. The harmonic rejection mixer includes phase adjustment circuits 11 and 12, phase difference detection circuits 21 and 22, mixers 31 to 33, gain amplifiers 41 to 43, and an adder 44. The mixers 31 to 33 receive a radio frequency signal (RF). Further, the harmonic rejection mixer receives a local signal 1 (LO1), a local signal 2 (LO2) having a phase difference of 45 degrees with respect to LO1, and a local signal 3 (LO3) having a phase difference of 90 degrees with respect to LO1.

The phase difference detection circuit 21 receives LO1 and LO2. LO2 is outputted from the phase adjustment circuit 11. The phase difference detection circuit 22 receives LO1 and LO3. LO3 is outputted from the phase adjustment circuit 12. The phase difference detection circuit 21 detects a phase difference between LO1 and LO2. Although the phase difference between LO1 and LO2 is ideally 45 degrees, actually a phase difference of 45 degrees±α1 (α1: phase error) occurs due to influence of noise, manufacturing variation, and the like. Similarly, the phase difference detection circuit 22 detects a phase difference between LO1 and LO3. Although the phase difference detected by the phase difference detection circuit 22 is ideally 90 degrees, actually a phase difference of 90 degrees±α2 (α2: phase error) occurs in a similar manner as in the phase difference detection circuit 21.

The phase difference detection circuit 21 outputs the detected phase difference to the phase adjustment circuit 11. The phase difference detection circuit 21 may output information related to the detected phase difference of 45 degrees±α1 or information related to the phase error α1. Similarly, the phase difference detection circuit 22 outputs information related to the detected phase difference of 90 degrees±α2 or information related to the phase error α2 to the phase adjustment circuit 12.

The phase adjustment circuit 11 adjusts the phase of inputted LO2 so that the phase error α1 becomes 0. The phase adjustment circuit 11 outputs the LO2 whose phase is adjusted to the mixer 32 and the phase difference detection circuit 21. The phase adjustment circuit 12 adjusts the phase of inputted LO3 so that the phase error α2 becomes 0. The phase adjustment circuit 12 outputs the LO3 whose phase is adjusted to the mixer 33 and the phase difference detection circuit 22.

The mixer 31 outputs an intermediate frequency signal 1 (IF1) having a frequency down-converted to |fRF±fLO1| by multiplying LO1 and RF to the gain amplifier 41. The fRF indicates the frequency of RF and the fLO1 indicates the frequency of LO1. The mixer 32 outputs an intermediate frequency signal 2 (IF2) having a frequency down-converted to |fRF±fLO2| by multiplying RF and LO2 corrected by the phase adjustment circuit 11 so that the phase difference between LO2 and LO1 becomes 0 to the gain amplifier 42. The fLO2 indicates the frequency of LO2. The mixer 33 outputs an intermediate frequency signal 3 (IF3) having a frequency down-converted to |fRF±fLO3| by multiplying RF and LO3 corrected by the phase adjustment circuit 12 so that the phase difference between LO3 and LO1 becomes 0 to the gain amplifier 43. The fLO3 indicates the frequency of LO3.

The gain amplifier 41 multiplies the gain of IF1 by 1 and outputs the IF1 to the adder 44. The gain amplifier 42 multiplies the gain of IF2 by √(2) and outputs the IF2 to the adder 44. The gain amplifier 43 multiplies the gain of IF3 by 1 and outputs the IF3 to the adder 44. The adder 44 sums up the received signals by a calculation of IF1+√(2)×IF2+IF3, and thereby outputs an IF signal in which third-order and fifth-order harmonic components are suppressed.

Next, a configuration example of the harmonic rejection mixer according to the first embodiment of the present invention will be described in detail with reference to FIG. 2. The harmonic rejection mixer includes a local signal source 51, a ¼ frequency dividing phase shifter 52, limiter amplifiers 61 to 63, limiter amplifiers 71 to 77, phase adjustment varactor capacitances 13 to 15, mixers 31 to 33, phase comparators 34 and 35, gain amplifiers 41 to 43, an adder 44, filer circuits 81 and 82, operational amplifiers 91 and 92, and reference voltages 93 and 94. The components given the same reference numerals as those in FIG. 1 have the same functions as those in FIG. 1, so the detailed description thereof will be omitted.

The local signal source 51 generates a local signal and outputs the local signal to the ¼ frequency dividing phase shifter 52. The ¼ frequency dividing phase shifter 52 divides the frequency of the local signal received from the local signal source 51 by 4 and outputs 0-degree, 45-degree, and 90-degree phase difference signals to the limiter amplifiers 61 to 63. The 45-degree phase difference signal is a signal having a phase difference of 45 degrees from the 0-degree phase difference signal outputted to the limiter amplifier 61. The 90-degree phase difference signal is a signal having a phase difference of 90 degrees from the 0-degree phase difference signal outputted to the limiter amplifier 61. Although, as a phase shifter, the ¼ frequency dividing phase shifter is described in FIG. 2, an RC type passive shifter may be used.

The limiter amplifier 61 outputs the 0-degree phase difference signal to the limiter amplifiers 71, 74, and 76. The limiter amplifier 62 outputs the 45-degree phase difference signal to the limiter amplifiers 72 and 75. The limiter amplifier 63 outputs the 90-degree phase difference signal to the limiter amplifiers 73 and 77. At this time, the limiter amplifiers 74 to 77 are operated as replica circuits of the limiter amplifiers 71 to 73, so the limiter amplifiers 74 to 77 have the same circuit, the same shape, and the same characteristics as those of the limiter amplifiers 71 to 73. The limiter amplifiers 74 to 77 adjust the amplitude of received signal and output the signal to the phase comparator 34 or 35. The phase comparator 34 receives the 0-degree phase difference signal and the 45-degree phase difference signal from the limiter amplifiers 74 and 75 and performs a phase comparison operation.

Figure 3:
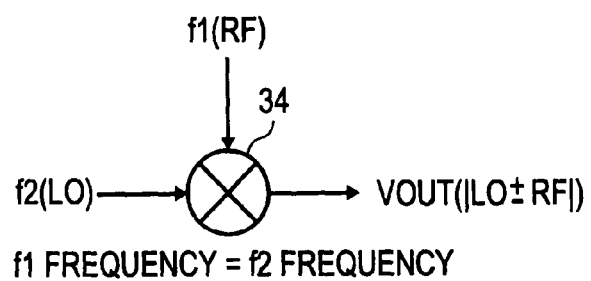
FIG. 3 is a diagram showing an operation of a mixer according to the first embodiment.
Figure 4:
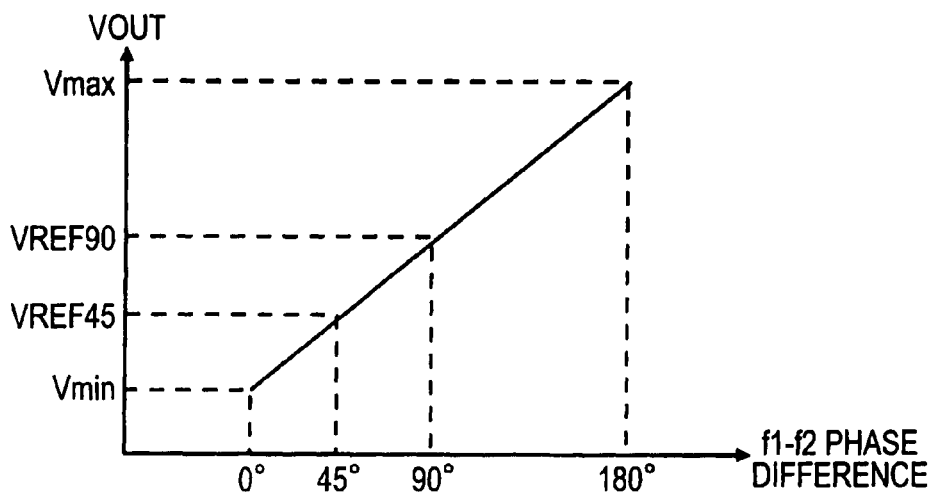
FIG. 4 is a diagram showing an output voltage from the mixer according to the first embodiment.

Here, the phase comparison operation performed in the phase comparators 34 and 35 will be described with reference to FIGS. 3 and 4. As shown in FIG. 3, when the frequencies of two inputted signals are the same, the phase comparators 34 and 35 output a known voltage in a phase difference range between 0 degrees and 180 degrees. Ideally, as shown in FIG. 4, when the phase difference is 0 degree, the voltage outputted from the phase comparators 34 and 35 is a minimum value Vmin in the operation range. When the phase difference is 180 degrees, the voltage outputted from the phase comparators 34 and 35 is a maximum value Vmax in the operation range. When the phase difference is 90 degrees, the voltage outputted from the phase comparators 34 and 35 is (Vmax+Vmin)/2. When the phase difference is 45 degrees, the voltage outputted from the phase comparators 34 and 35 is (Vmax+Vmin)/4. When the voltage outputted from the phase comparator 34 is a voltage indicating 45 degrees, the 45-degree phase difference signal has a phase difference of 45 degrees from the 0-degree phase difference signal. Here, when the phase difference is 45±α1 degrees, the phase comparator 34 outputs a voltage near the known voltage (Vmax+Vmin)/4. The phase comparator 35 operates in the same manner.

Return to FIG. 2. The phase comparator 34 outputs a voltage value obtained by comparing the 0-degree phase difference signal and the 45-degree phase difference signal to the operational amplifier 91 via the filer circuit 81. Similarly, the phase comparator 35 outputs a voltage value obtained by comparing the 0-degree phase difference signal and the 90-degree phase difference signal to the operational amplifier 92 via the filer circuit 82. The operational amplifier 91 compares the reference voltage 93 of VREF45=(Vmax+Vmin)/4 with the voltage outputted from the phase comparator 34. The filer circuits 81 and 82 remove a useless harmonic component and output a voltage value to the operational amplifiers 91 and 92 respectively. The operational amplifier 91 applies a voltage to the phase adjustment varactor capacitance 14 so that the phase error a1 is corrected to 0. The operational amplifier 92 compares the reference voltage 94 of VREF90=(Vmax+Vmin)/2 with the voltage outputted from the phase comparator 35. The operational amplifier 92 applies a voltage to the phase adjustment varactor capacitance 15 so that the phase error α2 is corrected to 0.

The phase adjustment varactor capacitances 13 to 15 can adjust a phase in order to delay the phase of the LO signal when the capacitance increases from a reference varactor capacitance value Cref(F) such as Cref+ΔC and advance the phase of the LO signal when the capacitance decreases such as Cref−ΔC. Therefore, when the phase of the 45-degree phase difference signal advances, the operational amplifier 91 applies a relatively high voltage to the phase adjustment varactor capacitance 14 in order to increase the capacitance of the phase adjustment varactor capacitance 14. On the other hand, when the phase of the 45-degree phase difference signal delays, the operational amplifier 91 applies a relatively low voltage to the phase adjustment varactor capacitance 14 in order to decrease the capacitance of the phase adjustment varactor capacitance 14. Similarly, the operational amplifier 92 adjusts the voltage applied to the phase adjustment varactor capacitance 15.

The phase adjustment varactor capacitance 14 adjusts the phase of the 45-degree phase difference signal received from the limiter amplifier 62 and outputs the signal to the mixer 32 via the limiter amplifier 72. The phase adjustment varactor capacitance 15 adjusts the phase of the 90-degree phase difference signal received from the limiter amplifier 63 and outputs the signal to the mixer 33 via the limiter amplifier 73.

The operations of the mixers 31 to 33, the gain amplifiers 41 to 43, and the adder 44 are the same as those in FIG. 1, so the detailed descriptions thereof will be omitted.

As described above, the phase comparators 34 and 35 and the operational amplifiers 91 and 92 are used to adjust the capacitances of the phase adjustment varactor capacitances 14 and 15, and thereby the phase errors of the 45-degree phase difference signal and the 90-degree phase difference signal are suppressed. Therefore, by the operations of the mixers 31 to 33 and the following circuits, it is possible to obtain a good harmonic rejection suppression ratio.

Second Embodiment

Figure 5:
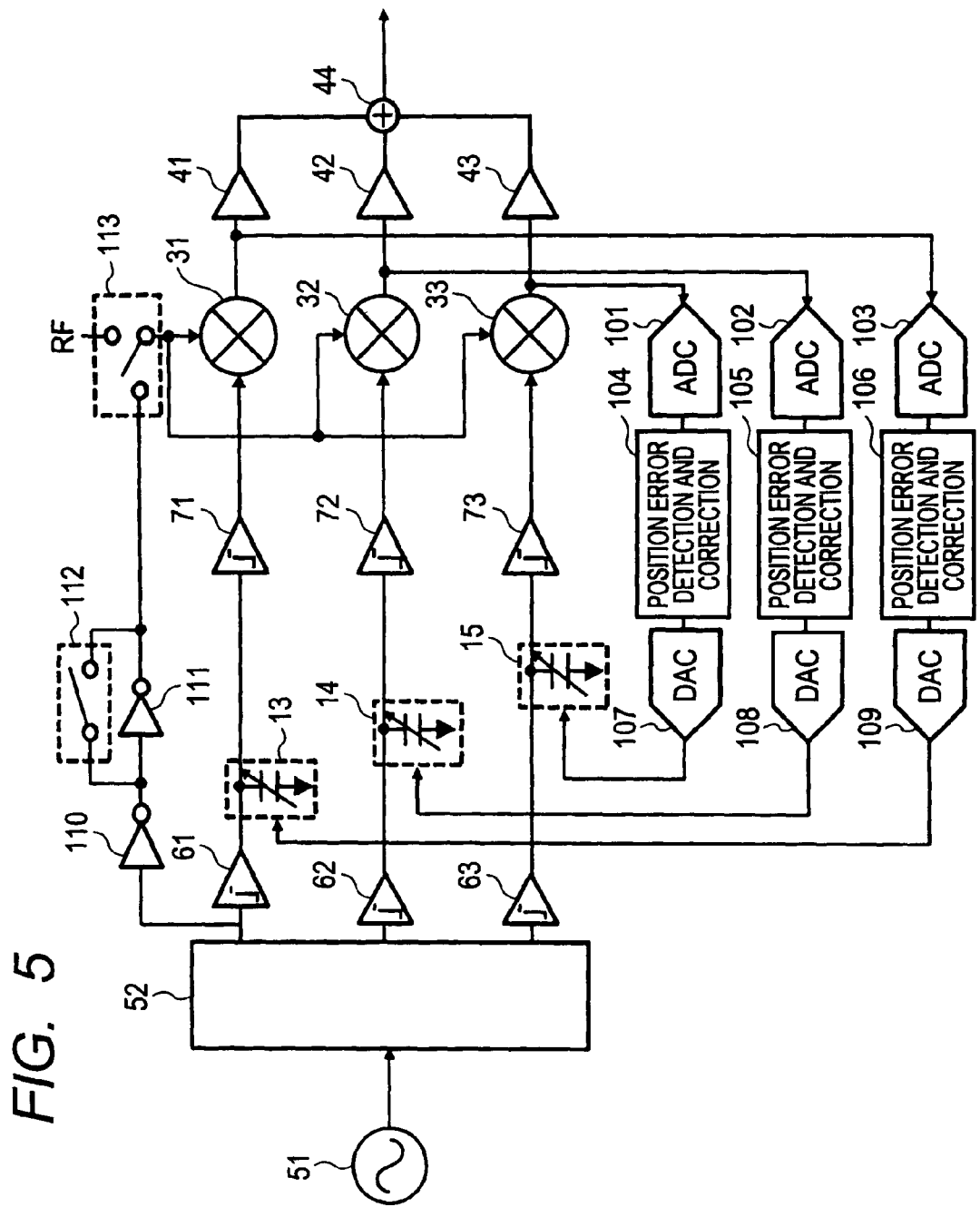
FIG. 5 is a configuration diagram of a harmonic rejection mixer according to a second embodiment.

Next, a configuration example of a harmonic rejection mixer according to the second embodiment of the present invention will be described with reference to FIG. 5. The harmonic rejection mixer in FIG. 5 includes a local signal source 51, a ¼ frequency dividing phase shifter 52, limiter amplifiers 61 to 63, phase adjustment varactor capacitances 13 to 15, limiter amplifiers 71 to 73, mixers 31 to 33, gain amplifiers 41 to 43, an adder 44, ADCs (analog to digital converters) 101 to 103, phase error detection/correction circuit 104 to 106, DACs (digital to analog converters) 107 to 109, inverters 110 and 111, and switches 112 and 113. The local signal source 51, the ¼ frequency dividing phase shifter 52, the limiter amplifiers 61 to 63, the phase adjustment varactor capacitances 13 to 15, the limiter amplifiers 71 to 73, the mixers 31 to 33, the gain amplifiers 41 to 43, and the adder 44 have the same functions as those shown in the harmonic rejection mixer in FIG. 2, so the detailed description thereof will be omitted.

Figure 2:
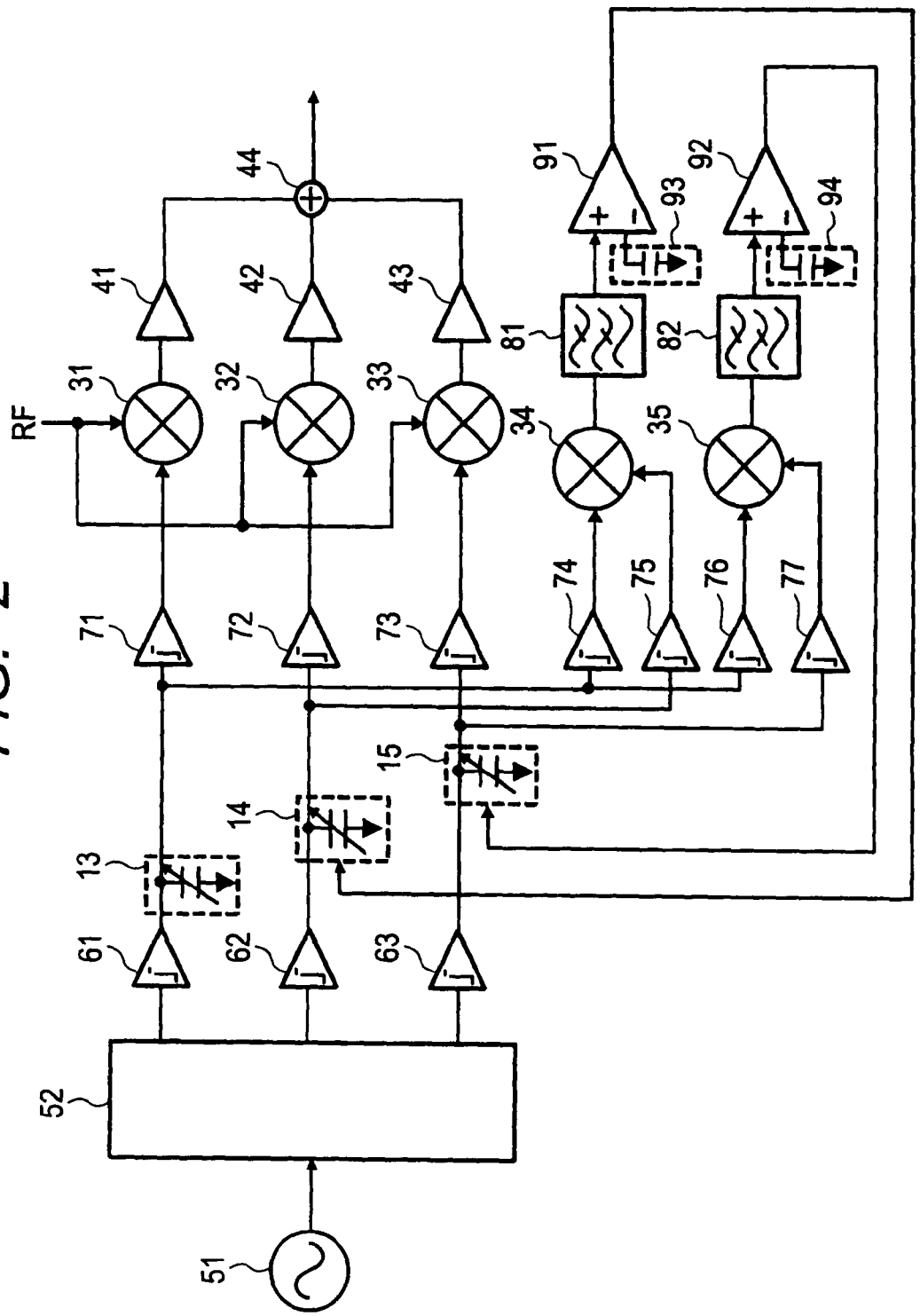
FIG. 2 is a configuration diagram of the harmonic rejection mixer according to the first embodiment.

The harmonic rejection mixer in FIG. 2 have a correction time period for performing phase error detection and phase error correction and a normal time period for outputting an intermediate frequency signal. Hereinafter, an operation of the harmonic rejection mixer in the correction time period will be described.

In the correction time period, the mixers 31 to 33 switch the switch 113 and receive the LO signal instead of the RF signal. The LO signal received by the mixers 31 to 33 is the 0-degree phase difference signal outputted from the ¼ frequency dividing phase shifter 52.

First, the harmonic rejection mixer detects and corrects the phase error of the 0-degree phase difference signal. In this case, the switch 112 is opened. Thereby, the 0-degree phase difference signal is outputted from the ¼ frequency dividing phase shifter 52 to the mixer 31 via the inverters 110 and 111. The mixer 31 receives the 0-degree phase difference signal via the limiter amplifiers 61 and 71.

The mixer 31 outputs a voltage value determined by a phase difference between the 0-degree phase difference signal outputted from the inverter 111 and the 0-degree phase difference signal outputted from the limiter amplifier 71 to the ADC 103. The mixer 31 compares the phases of the two 0-degree phase difference signals, so, ideally the value of Vmin shown in FIG. 4 is outputted. However, considering the phase error generated when the 0-degree phase difference signal passes through the limiter amplifiers 61 and 71, a voltage different from the Vmin is outputted to the ADC 103.

The ADC 103 converts information related to the voltage outputted from the mixer 31 into a digital signal and detects a voltage value. The phase error detection/correction circuit 106 adjusts a voltage that controls the phase adjustment varactor capacitance 13 so that the voltage detected by the ADC 103 becomes minimum. The voltage outputted to the phase adjustment varactor capacitance 13 is converted into an analog signal by the DAC 109 and outputted. The phase error detection/correction circuit 106 repeats a plurality of times the correction processing of the phase error so that the voltage detected by the ADC 103 becomes minimum. When the phase error detection/correction circuit 106 performs the correction processing a plurality of times and the voltage detected by the ADC 103 becomes minimum, the phase error detection/correction circuit 106 holds the voltage outputted to the phase adjustment varactor capacitance 13.

Next, the harmonic rejection mixer detects and corrects the phase error of the 180-degree phase difference signal. In this case, the switch 112 is short-circuited. Thereby, the 0-degree phase difference signal outputted from the ¼ frequency dividing phase shifter 52 is outputted to the mixer 31 via the inverter 110 and the switch 112. The phase of the 0-degree phase difference signal is inverted by the inverter 110, so the mixer 31 receives the 180-degree phase difference signal having a phase difference of 180 degrees from the 0-degree phase difference signal from the inverter 110. The mixer 31 receives the 0-degree phase difference signal via the limiter amplifiers 61 and 71. In this way, the maximum voltage value is detected in the same manner as in the processing in which the minimum voltage value is detected. When the voltage detected by the ADC 103 becomes maximum, the phase error detection/correction circuit 106 holds the voltage outputted to the phase adjustment varactor capacitance 13.

In this way, by detecting the minimum voltage value outputted when the phase difference is 0 degrees and the maximum voltage value outputted when the phase difference is 180 degrees, it is possible to calculate an expected voltage value when the phase difference is 45 degrees as (minimum voltage value+maximum voltage value)/4. Also, it is possible to calculate an expected voltage value when the phase difference is 90 degrees as (minimum voltage value+maximum voltage value)/2.

Next, the switch 112 is opened. Thereby, the mixer 32 receives the 0-degree phase difference signal via the switch 113 and receives the 45-degree phase difference signal via the limiter amplifier 72. The mixer 32 outputs a voltage value determined by a phase difference between the received 0-degree phase difference signal and the 45-degree phase difference signal to the ADC 102.

The ADC 102 converts information related to the voltage outputted from the mixer 32 into a digital signal and detects a voltage value. The phase error detection/correction circuit 105 adjusts a voltage that controls the phase adjustment varactor capacitance 14 so that the voltage detected by the ADC 102 becomes the expected voltage value when the phase difference is 45 degrees. The voltage outputted to the phase adjustment varactor capacitance 14 is converted into an analog signal by the DAC 108 and outputted. The phase error detection/correction circuit 105 repeats a plurality of times the correction processing of the phase error so that the voltage detected by the ADC 102 becomes the expected voltage value when the phase'difference is 45 degrees. When the phase error detection/correction circuit 105 performs the correction processing a plurality of times and the voltage detected by the ADC 102 becomes nearest to the expected voltage value, the phase error detection/correction circuit 105 holds the voltage outputted to the phase adjustment varactor capacitance 14. The phase error detection/correction circuit 104 adjusts a voltage value determined by a phase difference between the 0-degree phase difference signal and the 90-degree phase difference signal outputted from the mixer 33 and the ADC 101 so that the voltage value becomes the expected voltage value when the phase difference is 90 degrees. Further, the phase error detection/correction circuit 104 outputs an optimum voltage value to the phase adjustment varactor capacitance 15. The operation is the same as that when the phase difference is 45 degrees, so the detailed description will be omitted.

By performing the processing as described above, the phase error detection/correction circuits 104 to 106 can output a voltage value (control voltage value) that causes the phase error of the local signals (LO1 to LO3) received by the mixers 31 to 33 to be 0 to the phase adjustment varactor capacitances 13 to 15. After the control voltage values of the phase adjustment varactor capacitances 13 to 15 are determined, the switch 113 is switched, and the mixers 31 to 33 receive RF. When the mixers 31 to 33 receive RF, the harmonic rejection mixer starts the operation in the normal time period.

In the normal time period, the mixers 31 to 33, the gain amplifiers 41 to 43, and the adder 44 operate in the same manner as those in the first embodiment, and the third-order and the fifth-order harmonic components are suppressed to generate the intermediate frequency signal (IF).

Figure 6:
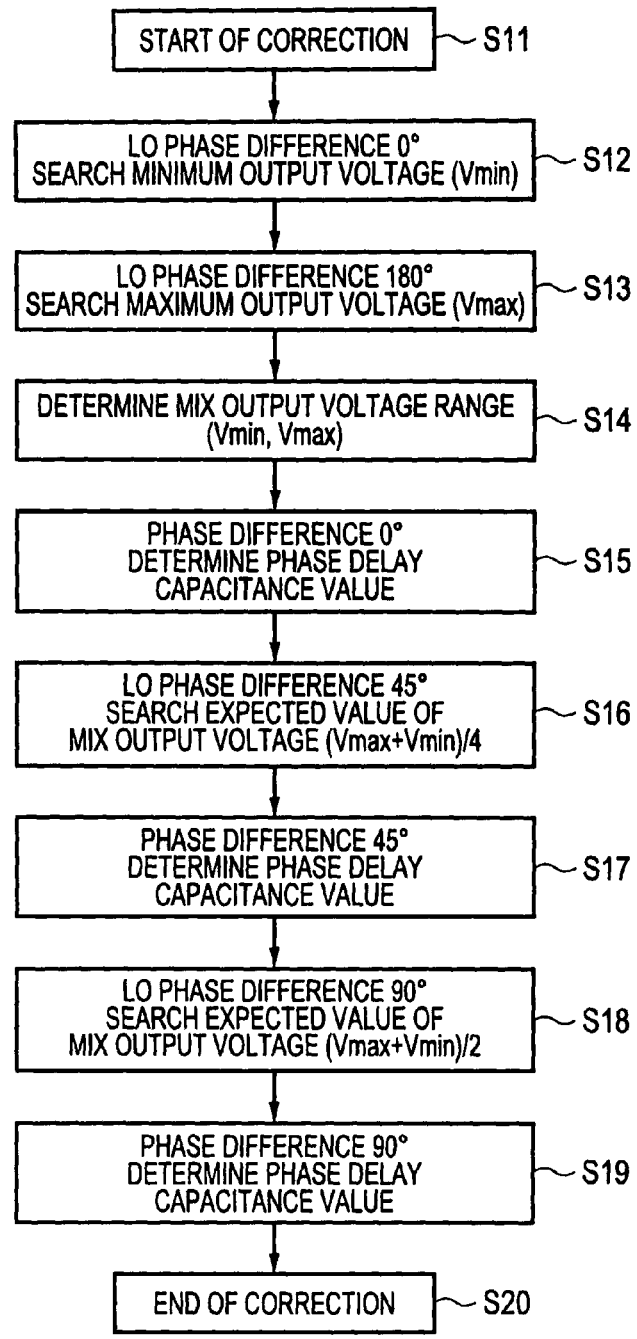
FIG. 6 is a flowchart of calculation processing of control voltage value according to the second embodiment.

Next, a flow of calculation processing of the control voltages of the phase adjustment varactor capacitances 13 to 15 according to the second embodiment of the present invention will be described with reference to FIG. 6.

First, by switching the switch 113 and outputting the LO signal (0-degree phase difference signal) to the mixers 31 to 33, the harmonic rejection mixer starts the operation in the correction time period. Thereby, the harmonic rejection mixer starts the correction processing of the phase adjustment varactor capacitances 13 to 15 (S11).

Next, the phase error detection/correction circuit 106 detects the minimum voltage value (Vmin) by using the 0-degree phase difference signal (S12). Specifically, the mixer 31 outputs a result of comparison between two 0-degree phase difference signals and the ADC 103 detects a voltage value corresponding to the phase difference between the two 0-degree phase difference signals. The phase error detection/correction circuit 106 detects the minimum voltage value by using the voltage value detected by the ADC 103.

Next, the phase error detection/correction circuit 106 detects the maximum voltage value (Vmax) by using the 0-degree phase difference signal and the 180-degree phase difference signal (S13). Specifically, the mixer 31 outputs a result of comparison between the 0-degree phase difference signal and the 180-degree phase difference signal and the ADC 103 detects a voltage value corresponding to the phase difference between the 0-degree phase difference signal and the 180-degree phase difference signal. The phase error detection/correction circuit 106 detects the maximum voltage value by using the voltage value detected by the ADC 103.

Next, the phase error detection/correction circuit 106 determines a range of voltage outputted from the mixers 31 to 33 (S14). Specifically, the phase error detection/correction circuit 106 determines the minimum voltage value (Vmin) and the maximum voltage value (Vmax).

Next, the phase error detection/correction circuit 106 determines a phase delay capacitance of the phase adjustment varactor capacitance 13 (S15). Specifically, the phase error detection/correction circuit 106 compares phases of two 0-degree phase difference signals, determines a control voltage by which the phase error becomes 0 degree or near 0 degree, and outputs the control voltage to the phase adjustment varactor capacitance 13.

Next, the phase error detection/correction circuit 105 calculates an expected voltage value when there is a phase difference of 45 degrees between two LO signals (S16). Specifically, the phase error detection/correction circuit 105 determines a value of (Vmin+Vmax)/4 as the expected voltage value when there is a phase difference of 45 degrees between two LO signals by using the Vmin and the Vmax determined by the phase error detection/correction circuit 106.

Next, the phase error detection/correction circuit 105 determines a phase delay capacitance of the phase adjustment varactor capacitance 14 (S17). Specifically, the phase error detection/correction circuit 105 determines a control voltage value by which a voltage value outputted according to the phase difference between the 0-degree phase difference signal and the 45-degree phase difference signal becomes the expected voltage value or near the expected voltage value. The phase error detection/correction circuit 105 outputs the determined control voltage value to the phase adjustment varactor capacitance 14.

Next, the phase error detection/correction circuit 104 calculates an expected voltage value when there is a phase difference of 90 degrees between two LO signals (S18). Specifically, the phase error detection/correction circuit 104 determines a value of (Vmin+Vmax)/2 as the expected voltage value by using the Vmin and the Vmax determined by the phase error detection/correction circuit 106.

Next, the phase error detection/correction circuit 104 determines a phase delay capacitance of the phase adjustment varactor capacitance 15 (S19). Specifically, the phase error detection/correction circuit 104 determines a control voltage value by which a voltage value outputted according to the phase difference between the 0-degree phase difference signal and the 90-degree phase difference signal becomes the expected voltage value or near the expected voltage value. The phase error detection/correction circuit 104 outputs the determined control voltage value to the phase adjustment varactor capacitance 15. Then, the calculation processing of the control voltages of the phase adjustment varactor capacitances 13 to 15 is completed (S20).

As described above, when the harmonic rejection mixer according to the second embodiment of the present invention is used, in the same manner as in the first embodiment, by controlling the capacitances of the phase adjustment varactor capacitances 13 to 15, it is possible to secure a good harmonic suppression ratio. An emitter-follower circuit shown in FIG. 7 may be used for the phase adjustment circuit shown in FIG. 1 instead of the phase adjustment varactor capacitances 13 to 15.

Figure 7:
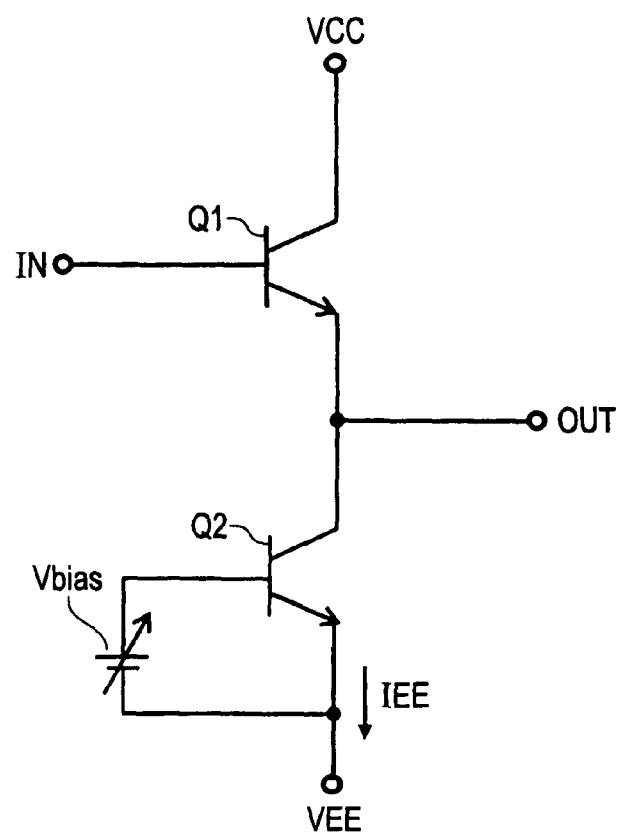
FIG. 7 is a configuration diagram of a phase adjustment circuit according to the first and the second embodiments.
Figure 8:
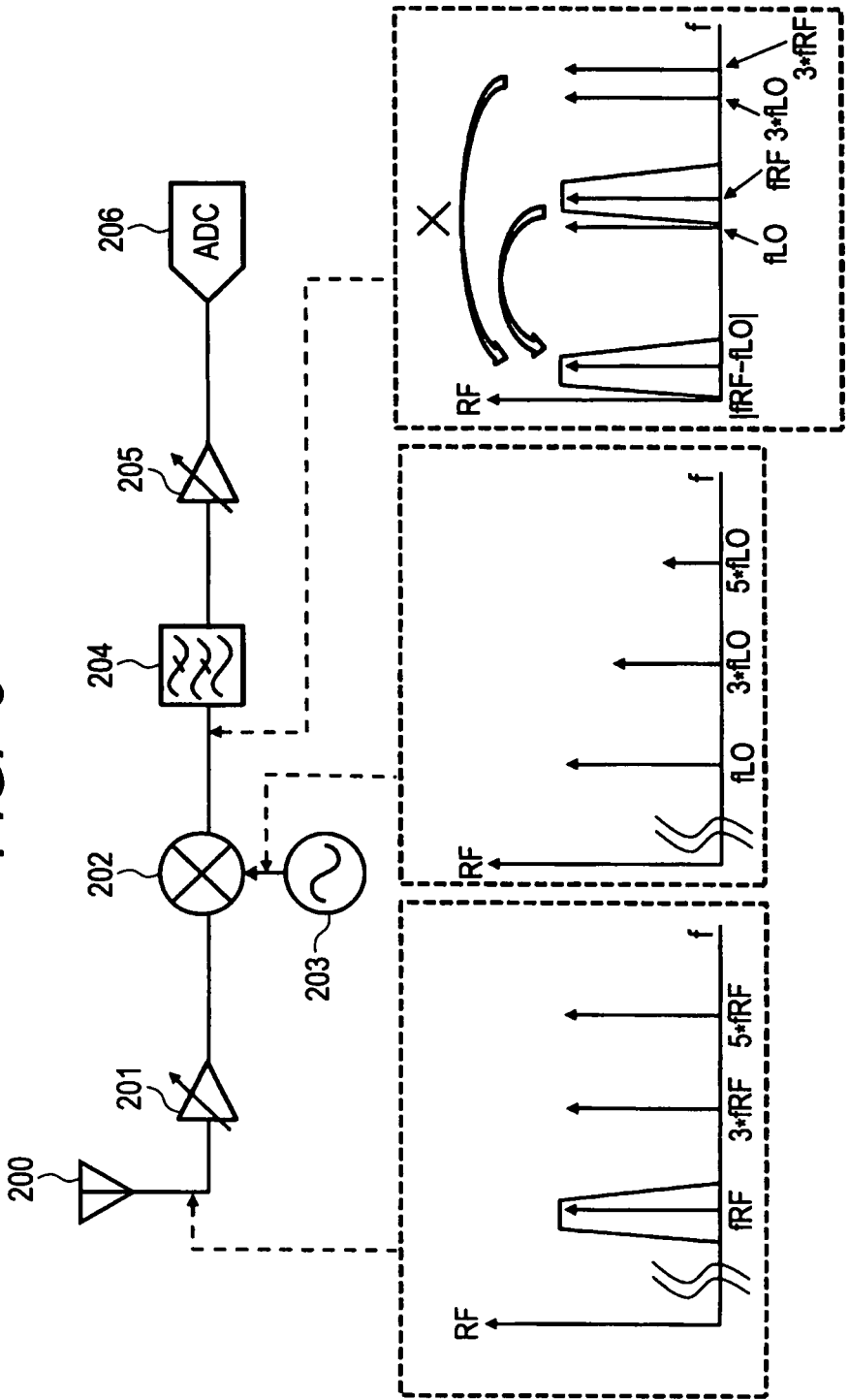
FIG. 8 is a configuration diagram of an ordinary receiver.
Figure 9:
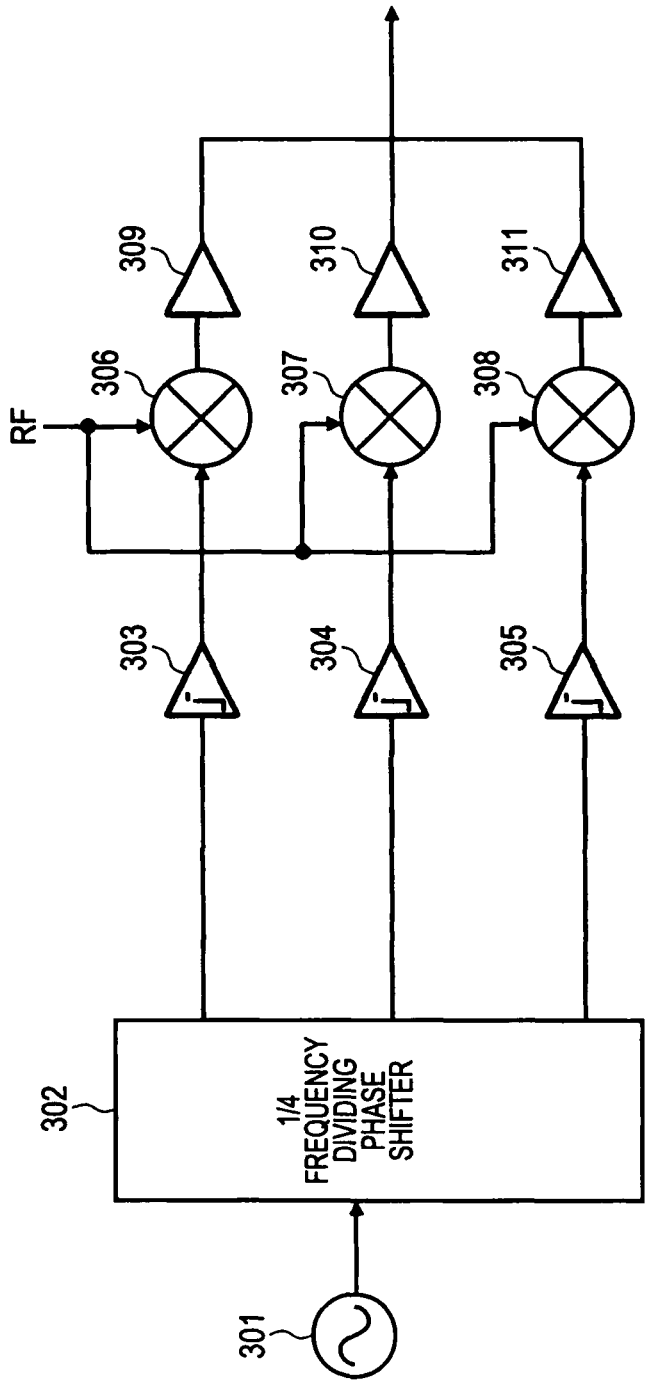
FIG. 9 is a configuration diagram of a harmonic rejection mixer in the related art.
Figure 10:
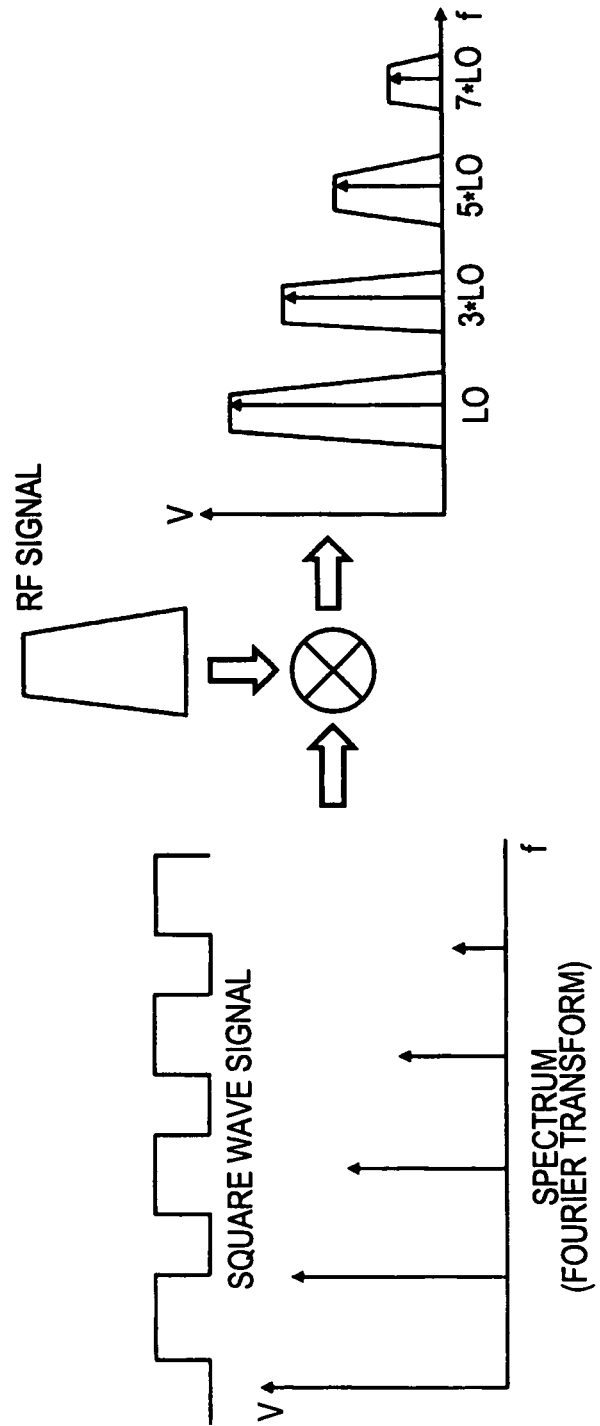
FIG. 10 is a diagram showing a signal component generated by a mixer in the related art.
Figure 11:
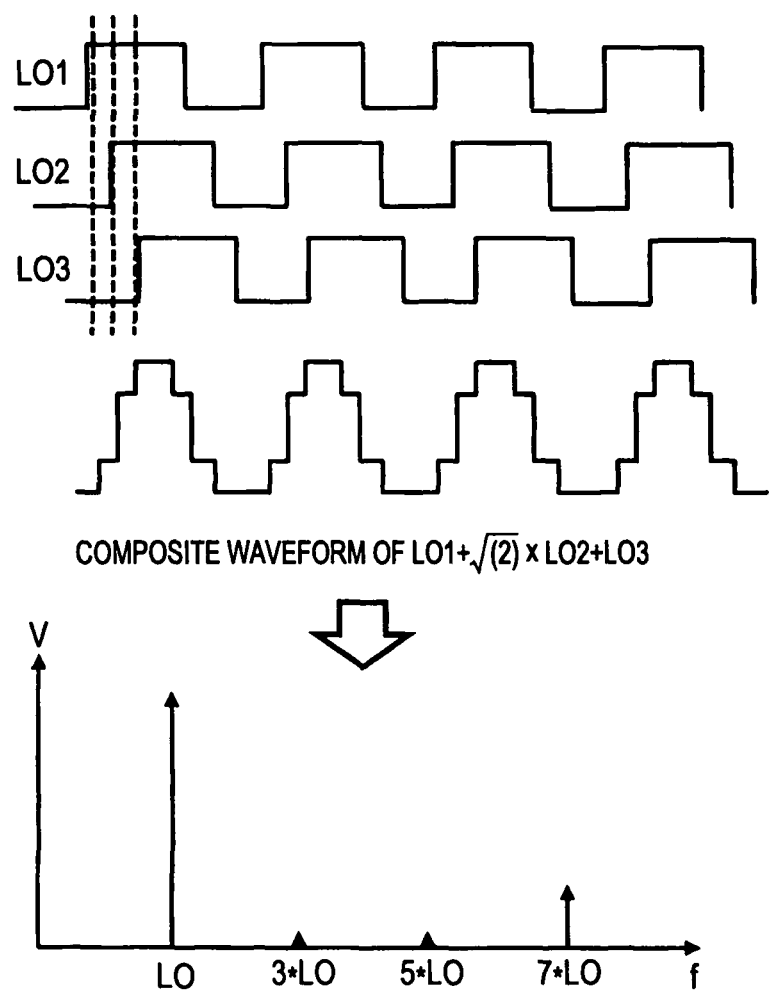
FIG. 11 is a diagram showing an operating principle of the harmonic rejection mixer in the related art.
Figure 12:
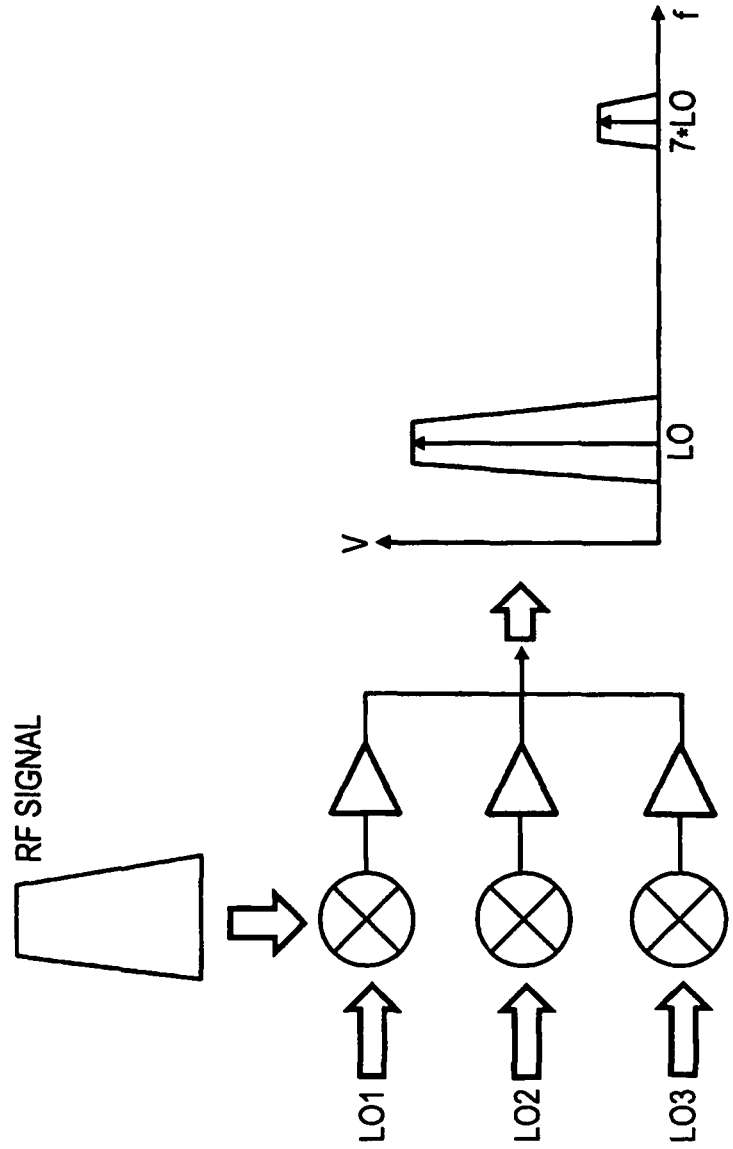
FIG. 12 is a diagram showing the operating principle of the harmonic rejection mixer in the related art.
Figure 13:
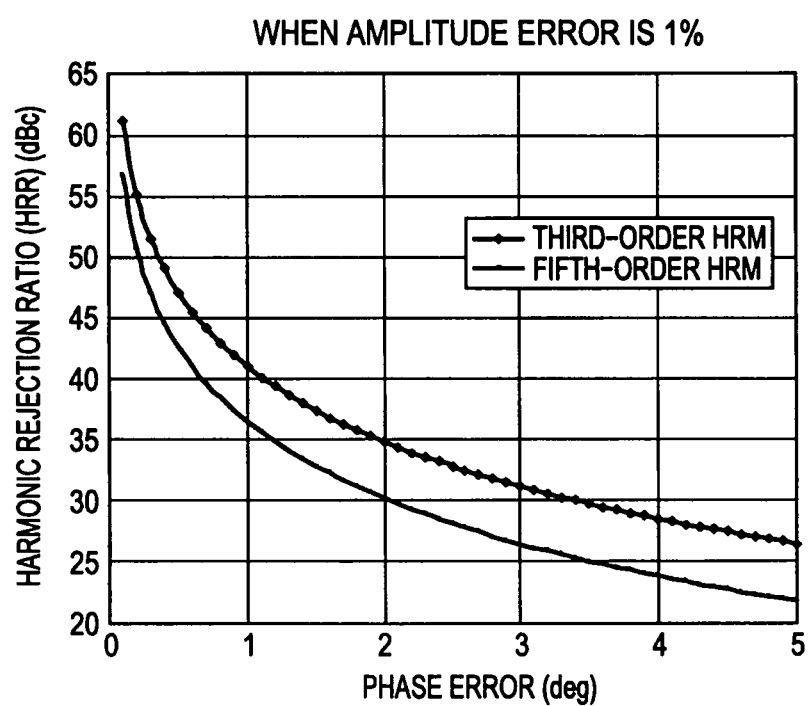
FIG. 13 is a diagram showing degradation of characteristics of the harmonic rejection mixer in the related art.

In the emitter-follower circuit shown in FIG. 7, bipolar transistors Q1 and Q2 are coupled in series between the positive power source VCC and the negative power source VEE. The output terminal OUT is coupled to the emitter of the bipolar transistor Q1 on the side of the positive power source VCC and the collector of the bipolar transistor Q2 on the side of the negative power source VEE. An analog signal is inputted to the bipolar transistor Q1 from the base of the bipolar transistor Q1 by using the input terminal IN, and the bipolar transistor Q1 is turned on. The voltage source Vbias is coupled to the base of the bipolar transistor Q2 to adjust a current flowing from the base to the bipolar transistor Q2. By changing the voltage source Vbias, it is possible to change the emitter current IEE of the emitter-follower circuit. In this way, by controlling the emitter current IEE, it is possible to change the phase of the analog signal inputted to the input terminal IN and output the analog signal from the output terminal OUT.

Further, different from the first embodiment of the present invention, the phase error is detected by using the signals outputted from the mixers 31 to 33. Therefore, the phase error detection/correction circuits 104 to 106 can cancel the phase error generated in a signal line through which a signal actually passes in the normal time period. Thus, it is possible to secure a harmonic suppression ratio better than that of the first embodiment.

The present invention is not limited to the above-described embodiments, but may be appropriately modified without departing from the scope and spirit of the present invention.

What is claimed is:

1. A harmonic rejection mixer configured to convert a frequency of a radio frequency signal based on a first, a second, and a third local signals, the harmonic rejection mixer comprising:
   a first mixer configured to output a first voltage indicating a phase difference between the first local signal and the second local signal;
   a second mixer configured to output a second voltage indicating a phase difference between the first local signal and the third local signal;
   a first adjustment circuit configured to adjust a phase of the second local signal based on the first voltage so that the phase difference between the first and the second local signals is a first predetermined phase difference; and
   a second adjustment circuit configured to adjust a phase of the third local signal based on the second voltage so that the phase difference between the first and the third local signals is a second predetermined phase difference.

2. The harmonic rejection mixer according to claim 1,
   wherein the harmonic rejection mixer adjusts the phase of the second local signal so that the first voltage is a first predetermined voltage, and
   wherein the harmonic rejection mixer adjusts the phase of the third local signal so that the second voltage is a second predetermined voltage.

3. The harmonic rejection mixer according to claim 2,
   wherein the first adjustment circuit includes a first variable-capacitance diode configured to adjust a capacitance thereof based on the first voltage, and
   wherein the second adjustment circuit includes a second variable-capacitance diode configured to adjust a capacitance thereof based on the second voltage.

4. The harmonic rejection mixer according to claim 1, further comprising:
   a third mixer configured to mix the radio frequency signal and the first local signal;
   a fourth mixer configured to mix the radio frequency signal and the second local signal; and
   a fifth mixer configured to mix the radio frequency signal and the third local signal.

5. The harmonic rejection mixer according to claim 4, wherein the first mixer has approximately the same characteristic as the third mixer.

6. The harmonic rejection mixer according to claim 1, further comprising:
   a switch coupled to the first and the second mixers to output the radio frequency signal to the first and the second mixers within a normal time period and to output a correction signal based on the first local signal to the first and the second mixers within a correction time period.

7. The harmonic rejection mixer according to claim 6, further comprising a third mixer configured to mix the radio frequency signal and the first local signal within the normal time period.

8. A phase adjustment method of a first, a second, and a third local signals whose phases are different from each other in a harmonic rejection mixer for converting a frequency of a radio frequency signal by using the first, the second, and the third local signals, the phase adjustment method comprising the steps of:

calculating a first output voltage determined by a phase difference between the first local signal and a first reference signal having substantially the same phase as that of the first local signal;

calculating a second output voltage determined by a phase difference between the first local signal and a second reference signal having a phase reverse to that of the first local signal;

calculating a third and a fourth output voltages determined by a predetermined phase difference by using the first and the second output voltages;

adjusting the phase of the first local signal according to the first output voltage; and adjusting the phases of the second and the third local signals according to the third and the fourth output voltages.

* * * * *